United States Patent [19]

Nagumo et al.

[11] Patent Number: 4,809,598

[45] Date of Patent: Mar. 7, 1989

[54] IMAGE FORMING APPARATUS WITH VARIABLE TRANSFER PRESSURE

[75] Inventors: Akihiko Nagumo; Minoru Ishikawa, both of Kanagawa, Japan

[73] Assignee: Fuji Photo Film Co., Ltd., Kanagawa, Japan

[21] Appl. No.: 71,127

[22] Filed: Jul. 8, 1987

[30] Foreign Application Priority Data

Jul. 9, 1986 [JP] Japan ................................ 61-161224

[51] Int. Cl.$^4$ ............................................... B30B 3/04
[52] U.S. Cl. ........................................ 100/156; 355/16
[58] Field of Search ................... 355/16, 27; 118/657; 428/910; 427/151; 100/156

[56] References Cited

U.S. PATENT DOCUMENTS

| 4,481,252 | 11/1984 | Postle et al. | 428/910 X |
| 4,637,973 | 1/1987 | Shigeta et al. | 118/657 X |
| 4,658,276 | 4/1987 | Kanda et al. | 427/151 X |
| 4,760,426 | 7/1988 | Taniguchi et al. | 355/27 |

*Primary Examiner*—Andrew M. Falik
*Attorney, Agent, or Firm*—Sughrue, Mion, Zinn, Macpeak and Seas

[57] ABSTRACT

A latent image on an exposed and developed sheet S of photosensitive material coated with microcapsules containing a color forming substance is transferred to a superposed image receiving sheet C by applying pressure to rupture some of the microcapsules. The applied pressure is selectively varied between at least two levels to attendantly control the color density of the transferred image.

6 Claims, 2 Drawing Sheets

IMAGE FORMING APPARATUS WITH VARIABLE TRANSFER PRESSURE

BACKGROUND OF THE INVENTION

1. FIELD OF THE INVENTION

This invention relates to a pressure image forming apparatus which fixes, under pressure, an image obtained by exposure to an original image.

2. DESCRIPTION OF THE PRIOR ART

An example of an image recording medium in which microcapsules containing a photosensitive composition are utilized is disclosed in Japanese Kohai No. 179836/1982. This system has a substrate which carries capsules made of a synthetic polymeric resin and containing a vinyl compound, a photopolymerization initiator and a coloring precursor.

In an image recording method using this system, microcapsules are hardened in correspondence with an original image by being exposed thereto, and parts of the microcapsules which have not been hardened are ruptured by pressing so as to release the coloring agent precursor, thereby forming a color image. This method ensures that an image of a high quality can be obtained by simple dry-type processing, but this system suffers from a disadvantage in that the photosensitivity is much lower than with a system which makes use of silver halide.

The present applicant has proposed, in the specification of Japanese Kohai No. 275742/1986, a novel recording medium which has a high photosensitivity and which makes it possible to obtain an image of a high quality by a simple dry-type process. This recording medium comprises a photosensitive composition in which at least a photosensitive silver halide, a reducing agent, a polymerizable compound and a color image forming substance are applied over a substrate and in which at least the polymerizable compound and the color image forming substance consist of a photosensitive composition confined in common microcapsules.

An image recording method which makes use of this photosensitive medium is disclosed in the specification of Japanese Kohai No. 278849/1986 filed by the same applicant. According to this method, the photosensitive medium is first exposed so that a latent image is formed in conformity with an image to be recorded. The medium is thereafter developed by heating so that the polymerizable compound in the area where the latent image exists is polymerized to produce a polymeric compound, thereby setting the microcapsules. Then, the medium is superposed on an image receiving medium having an image receiving layer capable of receiving a color image forming substance, and is pressed onto the image receiving medium so that at least part of the microcapsules existing in areas where no part of the image is formed are ruptured so as to transfer the color image forming substance to the image receiving medium, thereby forming an image on the image receiving medium. It goes without saying that, in this heat transfer process, the larger the pressing force, the higher the coloring density of the transferred image.

In a known example of a pressing device used to effect the above-described process, the photosensitive medium and the image receiving medium superposed on each other are made to pass between a pair of press rollers. However, the pressing force thereof is constant and cannot be changed. Therefore, it is not possible for this type of device to satisfy a need to change, in accordance with the type of original character or photograph, a development factor which represents the relationship between an increment in the exposure value and a change in the coloring density of the image, namely, a so-called gamma ($\gamma$).

SUMMARY OF THE INVENTION

The present invention has been made in consideration of the above-described problems of the conventional pressure image forming apparatus, and an object of the present invention is to provide a pressure image forming apparatus which is capable of uniformly and constantly applying a desired pressing force over a predetermined area even if the thickness and/or the width of the photosensitive medium are changed and which is capable of changing the development factor by adjusting the pressing force.

To achieve this object, the present invention provides a pressure image forming apparatus in which an image, which is obtained by exposure to an original image on a photosensitive medium having a substrate to which a material capable of fixing, under pressure, an image obtained by exposure to an original image is applied, is fixed under pressure, the apparatus having a pressing device for pressing the photosensitive medium at least at two different levels.

The photosensitive medium used in accordance with the present invention may be of a type which is disclosed in the above-mentioned Japanese Kohai No. 278849/1986 filed by the present applicant and in which a color image forming substance is transferred to an image receiving medium having an image receiving layer so as to form an image on the image receiving medium, or a type which is disclosed in the specification of Japanese Kohai No. 53881/1986 and in which a color image is formed on a photosensitive medium without using any image receiving medium, that is, an image receiving layer is formed on the photosensitive medium itself.

DETAILED DESCRIPTION OF THE PREFERRED EMBODIMENTS

Figure 1:
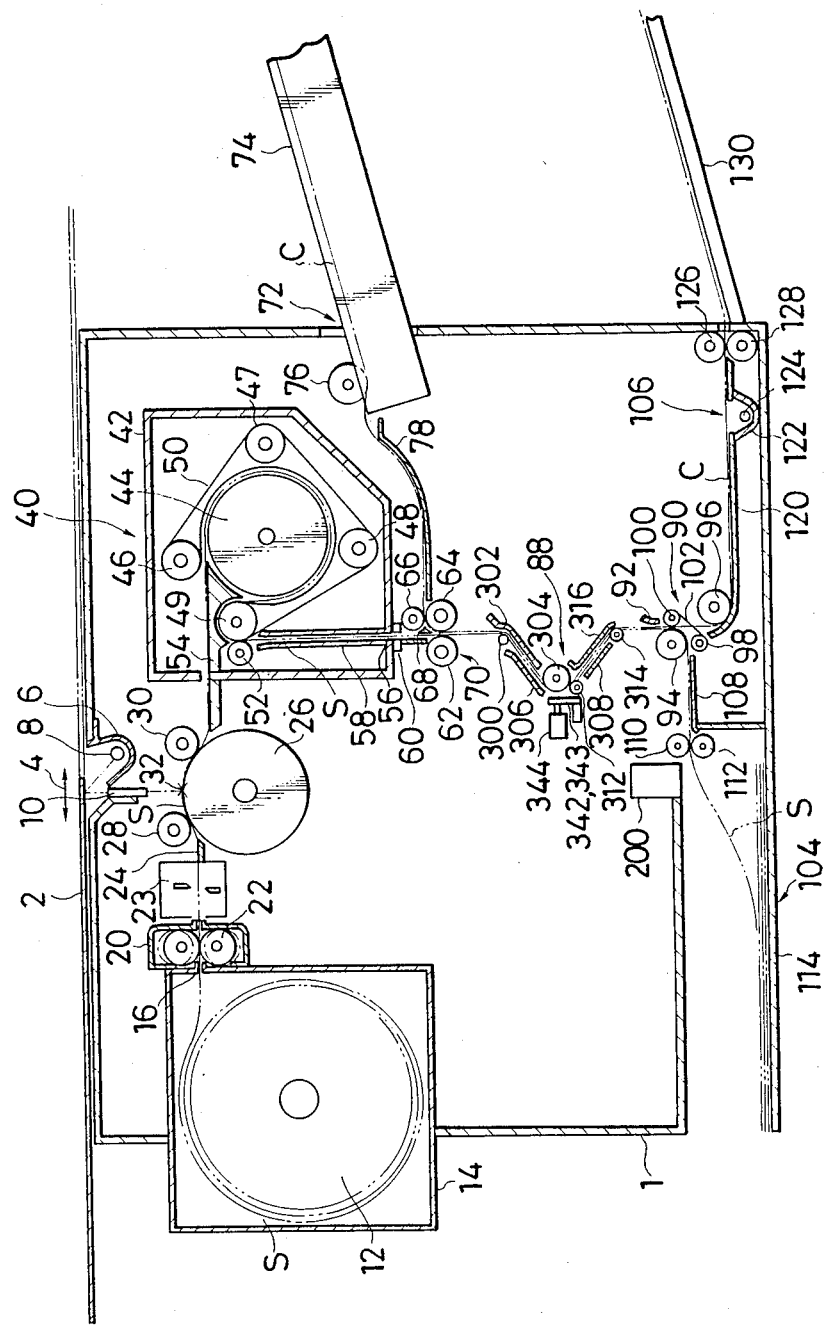
FIG. 1 is an illustration of the construction of an image recording apparatus which represents an embodiment of the present invention.

An image recording apparatus in which a pressure image forming apparatus which represents an embodiment of the present invention is incorporated will be described below with reference to the accompanying drawings. In the image recording apparatus embodying the present invention, an original support glass plate 2 is mounted on the upper surface of a housing 1 such as to be slidable in a reciprocating manner in the direction indicated by arrows 4, as shown in section in FIG. 1. That is, the glass plate 2 with an original placed on it facing downward slides between positions as indicated by the solid line and the chain double-dashed line in FIG. 1.

Under the glass plate 2 are disposed a lighting lamp 8 with a mirror 6 for illuminating the original, and a fiber lens array 10 for forming an image of the original on a photosensitive medium S placed in a predetermined position.

A sensitive medium cartridge which accommodates a sensitive medium roll 12 around which the photosensitive medium S is wound is detachably attached to a side portion of the housing 1. A pair of sensitive medium supplying rollers 22 accommodated in a magazine connection dark box 20 are disposed at an outlet 16 of the sensitive medium cartridge 14 for the photosensitive medium S. A desired length of photosensitive medium S which has been wound on roll 12 is thereby let out at a desired time. The rollers 22 move apart from each other as indicated by the chain lines to facilitate the advancement of the photosensitive medium S when the leading end of the photosensitive medium S moves thereto. A cutter unit 23 for cutting the photosensitive medium S and a guide plate 24 are disposed forward relative to the magazine connection dark box 20 (hereinafter, "forward" means "downstream" relative to the direction of advancement of the photosensitive medium S, etc.).

An exposed sensitive medium supporting roller 26 and two sensitive medium nip rollers 28 and 30 in contact with the supporting roller 26 under pressure are disposed forward relative to the guide plate 24. The photosensitive medium S which is guided by the guide plate 24 is brought close to the exposed sensitive medium supporting roller 26 by the sensitive medium nip rollers 28 and 30, and the fiber lens array 10 effects exposure of this medium to the image of the original in a position 32 between the sensitive medium nip rollers 28 and 30.

A heat development device 40 for effecting development by heating the photosensitive medium S after exposure is disposed forward relative to the exposed sensitive medium supporting roller 26. The heat development device 40 is provided with a development housing 42 having heat insulation property, a heating roller 44 which is disposed in the development housing 42 and which is heated to about 120°, an endless belt 50 which is wound around a circular arc on the outer periphery of the heating roller 44 through about 270° while being supported by four belt supporting rollers 46, 47, 48 and 49, and a nip roller 52 in contact with the supporting roller 49 under pressure.

The heat development device 40 is further provided with a guide device 54 which guides the photosensitive medium S supplied from the exposed sensitive medium supporting roller 26 onto the heating roller 44 and which detaches the photosensitive medium S from the heating roller 44 after heat-development, and a vertical guide device 58 for guiding the photosensitive medium S transported by the supporting roller 49 and the nip roller 52 to an outlet 56. A sensitive medium end detecting sensor 60 is disposed at the outlet 56.

Immediately below the outlet 56 are disposed a superposing device 70 for superposing the photosensitive medium and image receiving paper on each other which is constituted by a pair of press-contact rollers 62 and 64, a nip roller 66 in contact with the press-contact roller 64, and a guide member 68 for guiding a sheet of image receiving paper C transported by the press-contact roller 64 and the nip roller 66 to the contacting portions of the press-contact rollers 62 and 64.

An image receiving paper supplying device 72 is disposed at the side of the superposing device 70. The image receiving paper supplying device 72 is constituted by an image receiving paper supply cassette 74 detachably attached such as to project from the housing 1, an image receiving paper feed roller 76 for feeding out the image receiving paper C from the inside of the cassette 74, and a guide plate 78 for guiding the image receiving paper C fed by the feed roller 76 to the contacting portions of the press-contact roller 64 and the nip roller 66. The image receiving paper C has a width smaller than that of the photosensitive medium S by about 6 mm and is superposed by the superposing device 70 in such a manner that the center of the image receiving paper C in the widthwise direction corresponds to that of the photosensitive medium S.

Figure 2:
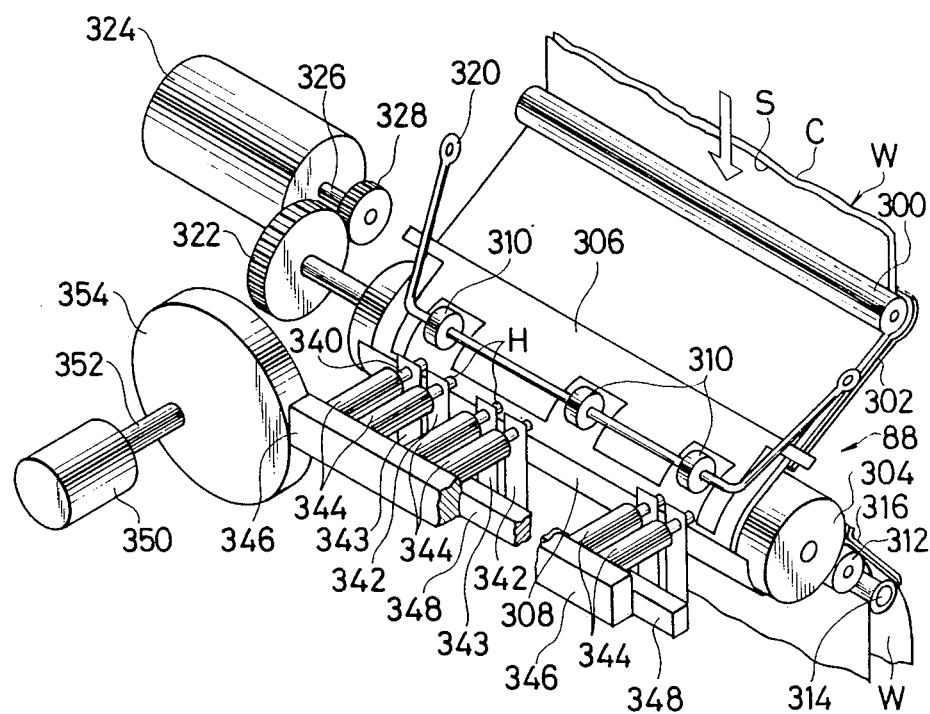
FIG. 2 is a perspective view of a transfer device.

A transfer device 88 which effects transfer by pressing the photosensitive medium S and the image receiving paper C which have been superposed (hereinafter called a sheet W) is disposed under the superposing device 70. As shown in FIGS. 1 and 2, the transfer device 88 has a transporting roller 300 for changing the direction of transportation of the sheet W, a guide plate 302 provided for the same purpose, a pressure roller 304, two guide plates 306 and 308 provided for the same purpose, a plurality of retaining rollers 310 for pressing the sheet W against the pressure roller 304, a nip roller 312 which acts to pinch the sheet W in cooperation with the pressure roller 304, and a transporting roller 314 and a guide plate 316 which change the direction of transportation of the sheet W supplied from the nip roller 312. The retaining rollers 310 are axially supported by a U-shaped bearing member 320 which is axially supported on the housing 1 (not shown in FIG. 2). The pressure roller 304 has at its one end a driving gear 322 which is meshed with a gear 328 attached to an output shaft 326 of a transporting motor 324.

The transfer device is further provided with a plurality of pairs of electromagnetic coils 344 which each face a corresponding pair of plate springs 342 and 343 having impact heads H and which attract the plate springs 342 and 343 to the tops of iron cores 340, an electromagnetic coil supporting member 346 for supporting the electromagnetic coils 344, and a plate spring supporting member 348 for supporting the plate springs 342 and 343. The plate springs 342 have a large elastic modulus and are used to apply a large pressing force, and the plate springs 343 have a small elastic modulus and are used to apply a small pressing force. These two types of springs are controlled by a gamma selection button (not shown) such that one of them is selectively driven. The electromagnetic coil supporting member 346 and the plate spring supporting member 348 which are integrally formed are slidably mounted on a guide rail member of known type (not shown) for movement parallel to the axis of the pressure roller, and are urged by a biasing spring or the like 304 toward the left-hand side in FIG. 2 to bring the electromagnetic coil supporting member 346 into contact with an eccentric cam 354 which is attached to a driving shaft 352 of a scanning motor 350. Each of the impact heads H is constituted by a wire or a bundle of a plurality of wires.

When, in the above arrangement, the sheet W is transported to the pressure roller 304 so as to be pinched by the nip roller 312, the operations of attracting and releasing the plate springs 342 and 343 at the iron cores 340 are repeated by the electromagnetic coils 344, so that the sheet W on the pressure roller 304 is partly pressed at the impact heads H by the resiliency of the plate springs 342 and 343. The transporting motor 324 and the scanning motor 350 are controlled by a control system (not shown) as described below. More specifically, the scanning motor 350 continuously rotates to cause the rotation of the eccentric cam 354 which reciprocatingly moves the electromagnetic supporting member 346 through a distance substantially equal to the interval between the adjacent mating electromagnetic coils 344. On the other hand, the transporting motor 324 rotates intermittently so as to transport the sheet W to an extent corresponding to the width of a portion thereof pressed by the impact head H in the direction of the transportation each time a going or returning stroke of the impact head H in the scanning operation is completed.

A separating device 90 for separating the photosensitive medium and the image receiving paper from each other is disposed below the transfer device 88. The separating device 90 is constituted by a guide member 92, a first feed roller 94, a second feed roller 96, and a separation belt 102 which is wound around the guide rollers 98 and 100 so as to be pressed only to the photosensitive medium S at each axial end of the first feed roller 94.

A sensitive medium disposal section 104 is disposed at one side of the separation device 90, while a fixing device 106 is disposed on the other side of the same. The sensitive medium disposal section 104 is constituted by a guide member 108, a pair of feed rollers 110 and 112, and a disposal box 114, and is adapted to send the photosensitive medium S from the separating device 90 into the disposal box 114 by means of the feed rollers 110 and 112.

The fixing device 106 is constituted by a guide member 120, an ultraviolet illuminating lamp 124 with a reflector 122, and a pair of feed rollers 126 and 128. The fixing device 106 is adapted to irradiate the image receiving paper C transported from the separating device 90 and guided by the guide member 120 with ultraviolet rays for 5 seconds, thereby fixing the image.

A delivery tray 130 for receiving the image receiving paper C is mounted forward relative to the fixing device 106 such as to project from the housing 1.

The image recording apparatus is further provided with a controller (not shown) to which are connected the lighting lamp 8, cutter unit 23, original supporting glass plate 2, sensor 60 for sensing the leading end of the sensitive medium, and the superposing device 70. The controller is adapted to control a series of operations which will be described below. The photosensitive medium S is set in such a manner that its leading end is positioned in the vicinity of the cutting portion of the cutter unit 23 or within the magazine connection dark box 20 when the apparatus is in a preparatory stage of its operation, that is, a so-called copy preparation stage.

Then, the color density or gamma selection button (not shown) is preliminarily selected in accordance with the color density of the original. When the copy start button (not shown) is thereafter pressed, the sensitive medium supplying rollers 22 operate to supply the photosensitive medium S and the lighting lamp 8 lights up to illuminate the original immediately befote the leading end of the photosensitive medium reaches a position 32. When the leading end of the photosensitive medium S reaches the position 32, the original supporting glass plates 2 is moved and the photosensitive medium S is fed in synchronism therewith, so that the image on the original is projected onto the photosensitive medium S, thereby exposing this medium. After the photosensitive medium S has been supplied by a distance equal to the length of the original in the moving direction, the cutter device 23 operates to cut the photosensitive medium S.

The photosensitive medium S thus exposed and then cut is supplied to the heat development device 40 where it is pressed by the endless belt 50 onto the heating roller 44 and is heated to about 120° C., thereby effecting development. Then, the sensor 60 senses that the leading end of the photosensitive medium S after development has passed the outlet 56.

Meanwhile, the image receiving paper supplying device 72 starts to operate in response to the pressing of the copy start button or in synchronism with the start of exposure so as to supply the image receiving paper C until the leading end of the paper C is brought into the nip between the pressing roller 64 and the nip roller 66.

The superposing device 70 then operates to superpose the image receiving paper C and the photosensitive medium S in such a manner that the image receiving paper C having a smaller width is centered in the widthwise direction relative to the photosensitive medium S having a larger width while the leading end of the image receiving paper C is aligned with that of the photosensitive medium S in the widthwise direction or several millimeters ahead thereof. The device 70 transports the image receiving paper and the photosensitive medium which have been superposed to the transfer device 88 where the electromagnetic coils 344 which correspond to the plate springs 342 or 343 which have been selected by the gamma selection button as described above are energized so that the sheet W is pressed by impact-pressing caused by the resiliency of the plate springs 342 or 343, thereby transferring the image to the image receiving paper.

After the transfer of the image, the photosensitive medium S is separated from the image receiving paper C by the separating belt 102 in the separating device 90 and is transported to the disposal section 104. Meanwhile, the image receiving paper C is transported to the fixing device 106 where it is irradiated with ultraviolet rays for 5 seconds, thereby fixing the image. The image receiving paper C is then sent to the delivery tray 130 by the feed rollers 126 and 128.

Modification of the above-described embodiment will now described below. The plate springs 342 and 343 used in the transfer device 88 have different elastic moduli, but the transfer device may be otherwise arranged such that the plate springs 342 and 343 have the same elastic modulus while the electromagnetic coils corresponding to these plate springs have different attracting forces. In another possible arrangement of the transfer device 88, the electromagnetic coils and the plate springs have the same properties, and a detachable intermediate retention member is provided for the plate springs in order to limit the extent of deformation of each plate spring due to the attraction. At the time of high-pressurization, the intermediate retention point does not act on each plate spring. On the other hand, at the time of low-pressurization, the intermediate retention member acts on the plate spring so as to reduce the extent of deformation of the plate spring due to the attraction effected by the electromagnetic coil. Also, the arrangement may be such that the pressing head moves by following the movement of the rotary cam so as to make the extent of deformation of the plate spring variable, or that compressed air vibrators are used instead of the driving source constituted by the electromagnetic coils and the cam while changing the air pressure so as to change the pressing force.

The lighting lamp 8 with reflecting mirror in accordance with this embodiment may be of any type capable of emitting radiation rays including visible rays. For instance, a strobe lamp, a flash lamp, a tungsten lamp, a mercury lamp, a halogen lamp such as an iodine lamp, a xenon lamp, a laser light source, a CRT light source, a plasma light source, a fluorescent lamp or a light-emitting diode can be used as the lighting source. It is also possible to use a combination of a micro-shutter array making use of LCD (Liquid Crystal), PLZT (plumbum zirconium titanate doped with lanthanum) or the like and a linear light source or a planer light source.

In the described embodiment, the exposure of the photosensitive medium S is effected by directly projecting the original image on the photosensitive medium S through the fiber lens array 10, but a spherical lens may be used in place of the fiber lens array 10. It is also possible to expose the photosensitive medium S indirectly through an image electric signal, by making use of a CRT, FOT (Finer Optic Tube), LCA (Liquid Crystal Array), electro-optical element array, a combination of a laser, modulator and a scanner or a combination of an LED and a scanner. In such a case, it is possible to effect on the image signal various processings for gradation correction, color correction and magnification and editing of the projected image.

In the described embodiment, the scanning of the original image is conducted by moving both the original and the photosensitive medium, while the optical system is kept stationary. It is also possible to effect the scanning by moving either one of the original and the photosensitive medium and the optical system.

In the heat development device 40 of the above described embodiment, the heating roller 44 is used for heating. However, the heat development device may be otherwise constructed such as to effect heating in the manner of belt heating, a thermal head having an array of heat-generating elements, electric heating, or irradiation by microwaves or infrared rays. It is possible to heat a different type of photosensitive medium S by utilizing eddy currents which are generated by electromagnetic induction. It is also possible to use a heating bath of a liquid which is inactive to the photosensitive medium S, e.g., a fluoro-liquid, as the means for heating. In these cases, the heating temperature generally ranges from 80° to 200° C., preferably 100° to 160° C.

In the above-described embodiment also, the image receiving paper C is superposed to the photosensitive medium S after development process to effect pressure transfer, but the present invention is also effective when applied to an image recording apparatus in which the development is effected on the development medium S after the image receiving paper C has been superposed on the medium S, thereafter effecting pressure transfer.

The above-described embodiment exemplifies a type of image recording apparatus in which the photosensitive medium is capable of transferring an image, in a pressing manner, to the image receiving layer formed on the image receiving medium. If a type of photosensitive medium having an image receiving layer is used, it is possible to eliminate the image receiving paper supplying device and the photosensitive medium disposal tray from the image recording apparatus.

In accordance with the present invention, as described above, the photosensitive medium is uniformly pressed over a wide area by a desired pressing force which can be adjusted in accordance with the original so as to set different development factors.

The invention has thus been shown and described with reference to specific embodiments. However, it should be noted that the invention is in no way limited to the details of the illustrated arrangement but changes and modifications may be without departing from the scope of the apended claims.

We claim:

1. An image forming apparatus, comprising:
   (a) means (6, 8, 10) for exposing a sheet (S) of photosensitive material coated with microcapsules containing a color forming substance to an original image, to thus form a latent image on said sheet,
   (b) means (40) for developing the exposed sheet to set the microcapsules,
   (c) means (70) for superposing the developed sheet with an image receiving sheet (C), and
   (d) means (88) for applying pressure to the superposed sheets to rupture at least some of the microcapsules and thereby transfer the color forming substance in said ruptured microcapsules to the image receiving sheet,
   (e) wherein said pressure applying means comprises a pressing device for selectively applying pressure at least two different pressure levels in accordance with a desired color density of the transferred image.

2. An image forming apparatus according to claim 1, wherein said pressure device comprises a support member (304) having a surface facing and supporting one surface of said superposed sheets, and an impact unit (342, 243, 344, H) for applying impacts to another, opposite surface of said superposed sheets.

3. An image forming apparatus according to claim 2, wherein said impact unit comprises a plurality of electromagnetic coils (344), a plurality of plate springs (342, 343) individually associated with said coils, and a plurality of impact heads, individually supported by said plate springs.

4. An image forming apparatus according to claim 3, wherein said impact unit is provided with a plurality of plate springs (342, 343) having different resilient forces.

5. An image forming apparatus according to claim 3, wherein said impact unit is provided with a plurality of electromagnetic coils (344) having different attracting forces.

6. An image forming apparatus according to claim 2, wherein said pressing device comprises means (350, 354) for laterally scanning said impact unit in a direction perpendicular to the direction of transportation of said superposed sheets.

* * * * *